(12) United States Patent
Pant et al.

(10) Patent No.: US 11,962,245 B2
(45) Date of Patent: Apr. 16, 2024

(54) DIGITAL CURRENT MODE CONTROL FOR MULTI-PHASE VOLTAGE REGULATOR CIRCUITS

(71) Applicant: Apple Inc., Cupertino, CA (US)

(72) Inventors: Sanjay Pant, Santa Clara, CA (US);
Fabio Gozzini, San Jose, CA (US);
Hubert Attah, Santa Clara, CA (US);
Jonathan F. Bolus, San Francisco, CA (US); Wenxun Huang, Redwood City, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/168,276

(22) Filed: Feb. 13, 2023

(65) Prior Publication Data
US 2023/0188043 A1    Jun. 15, 2023

Related U.S. Application Data

(63) Continuation of application No. 17/661,693, filed on May 2, 2022, now Pat. No. 11,581,813, which is a
(Continued)

(51) Int. Cl.
*H02M 3/157* (2006.01)
*G06F 1/3203* (2019.01)
(Continued)

(52) U.S. Cl.
CPC ........ *H02M 3/1584* (2013.01); *G06F 1/3203* (2013.01); *H02M 3/157* (2013.01); *H03M 1/12* (2013.01); *H02M 3/1586* (2021.05)

(58) Field of Classification Search
CPC .... H02M 3/1584; H02M 3/158; H02M 2/157; H02M 3/1586; H03M 1/12; G06F 1/3203
See application file for complete search history.

(56) References Cited

U.S. PATENT DOCUMENTS

| 8,344,712 B2 | 1/2013 | Martin et al. |
| 8,624,570 B2 | 1/2014 | O'Gorman et al. |

(Continued)

FOREIGN PATENT DOCUMENTS

| CN | 101361272 A | 2/2009 |
| CN | 108205351 A | 6/2018 |
| EP | 0508454 A2 | 10/1992 |

OTHER PUBLICATIONS

International Search Report and Written Opinion in PCT Appl. No. PCT/US2020/028216 dated Jul. 16, 2020, 13 pages.
(Continued)

*Primary Examiner* — Adolf D Berhane
(74) *Attorney, Agent, or Firm* — Kowert, Hood, Munyon, Rankin & Goetzel, P.C.; Dean M. Munyon

(57) ABSTRACT

A voltage regulator circuit included in a computer system may include multiple phase circuits coupled to a regulated power supply line via corresponding one of multiple inductors. The phase circuits may modify a voltage level of the regulated power supply line using respective control signals generated by a digital control circuit that processes multiple data bits. An analog-to-digital converter circuit may compare the voltage level of the regulated power supply node to multiple reference voltage levels and sample the resultant comparisons to generate the multiple data bits.

19 Claims, 8 Drawing Sheets

Related U.S. Application Data continuation of application No. 17/201,712, filed on Mar. 15, 2021, now Pat. No. 11,323,033, which is a continuation of application No. 16/877,260, filed on May 18, 2020, now Pat. No. 10,951,118, which is a continuation of application No. 16/387,316, filed on Apr. 17, 2019, now Pat. No. 10,658,931.

(51) Int. Cl.
*H02M 3/158* (2006.01)
*H03M 1/12* (2006.01)

(56) References Cited

U.S. PATENT DOCUMENTS

| | | | |
|---|---|---|---|
| 9,484,815 | B2 | 11/2016 | Dally |
| 9,857,854 | B2 | 1/2018 | Zhang et al. |
| 10,063,149 | B2 | 8/2018 | Akre et al. |
| 10,658,931 | B1 | 5/2020 | Pant et al. |
| 10,678,200 | B2 | 6/2020 | Matsuoka et al. |
| 10,951,118 | B2 | 3/2021 | Pant et al. |
| 11,323,033 | B2 | 5/2022 | Pant |
| 11,581,813 | B2 * | 2/2023 | Pant .................. H02M 3/157 |
| 2007/0013350 | A1 | 1/2007 | Tang et al. |
| 2008/0267301 | A1 | 10/2008 | Alfano et al. |
| 2008/0272752 | A1 | 11/2008 | Qiu et al. |
| 2009/0174262 | A1 | 7/2009 | Martin et al. |
| 2010/0328968 | A1 | 12/2010 | Adragna et al. |
| 2011/0084673 | A1 | 4/2011 | Chang et al. |
| 2011/0241640 | A1 | 10/2011 | Qiu et al. |
| 2016/0268904 | A1 | 9/2016 | Melendy et al. |
| 2018/0083534 | A1 | 3/2018 | Pant et al. |
| 2018/0191333 | A1 | 7/2018 | Chen et al. |
| 2018/0248481 | A1 | 8/2018 | Couleur et al. |
| 2018/0337599 | A1 | 11/2018 | Chen et al. |
| 2019/0273455 | A1 | 9/2019 | Lau |
| 2019/0305552 | A1 | 10/2019 | Cao et al. |
| 2019/0305560 | A1 | 10/2019 | Wang et al. |
| 2022/0109368 | A1 | 4/2022 | Zhou et al. |
| 2023/0188130 | A1 | 6/2023 | Bondade et al. |

OTHER PUBLICATIONS

Notification to Grant a Patent Right and a Notification on Payment of Registration in CN Appl. No. 202080029058.2 dated May 7, 2022, 3 pages.

Office Action in Korean Appl. No. 10-2021-7033255 mailed Dec. 11, 2023, 9 pages.

* cited by examiner

US 11,962,245 B2

DIGITAL CURRENT MODE CONTROL FOR MULTI-PHASE VOLTAGE REGULATOR CIRCUITS

PRIORITY INFORMATION

The present application is a continuation of U.S. application Ser. No. 17/661,693, entitled "DIGITAL CURRENT MODE CONTROL FOR MULTI-PHASE VOLTAGE REGULATOR CIRCUITS," filed May 2, 2022 (now U.S. Pat. No. 11,581,813), which is a continuation of U.S. application Ser. No. 17/201,712, entitled "DIGITAL CURRENT MODE CONTROL FOR MULTI-PHASE VOLTAGE REGULATOR CIRCUITS," filed Mar. 15, 2021 (now U.S. Pat. No. 11,323,033), which is a continuation of U.S. application Ser. No. 16/877,260, entitled "DIGITAL CURRENT MODE CONTROL FOR MULTI-PHASE VOLTAGE REGULATOR CIRCUITS," filed May 18, 2020 (now U.S. Pat. No. 10,951,118), which is a continuation of U.S. application Ser. No. 16/387,316, entitled "DIGITAL CURRENT MODE CONTROL FOR MULTI-PHASE VOLTAGE REGULATOR CIRCUITS," filed on Apr. 17, 2019 (now U.S. Pat. No. 10,658,931); the disclosures of each of the above-referenced applications are incorporated by reference herein in their entireties.

BACKGROUND

Technical Field

This disclosure relates to power management in computer systems and, more particularly, to voltage regulator circuit operation.

Description of the Related Art

Modern computer systems may include multiple circuits blocks designed to perform various functions. For example, such circuit blocks may include processors, processor cores configured to execute software, or program instructions. Additionally, the circuit blocks may include memory circuits, mixed-signal or analog circuits, and the like.

In some computer systems, the circuit blocks may be designed to operate using different power supply voltage levels. For example, in some computer systems, power management circuits (also referred to as "power management units") may generate and monitor various power supply signals.

Power management circuits often include one or more power converter circuits configured to generate regulated voltage levels on respective power supply signal lines using a voltage level of an input power supply signal. Such converter circuits may employ multiple reactive circuit elements such as inductors, capacitors, and the like.

SUMMARY OF THE EMBODIMENTS

Various embodiments for power converter circuits are disclosed. Broadly speaking, a plurality of phase circuits are each coupled to a regulated power supply line via a respective inductor and may be configured to modify a voltage level of the regulated power supply line using a respective one of a plurality of control signals. An analog-to-digital converter circuit may be configured to compare a voltage level of a regulated power supply signal to a plurality of reference voltage levels to generate a plurality of data bits. A digital control circuit may be configured to generate a plurality of control data words using the plurality of data bits, and generate a corresponding one of the plurality of control signals using a corresponding one of the control data words. In another embodiment, the analog-to-digital converter circuit may include a voltage divider circuit configured to generate the plurality of reference voltage levels using a primary voltage reference.

Figure 1:
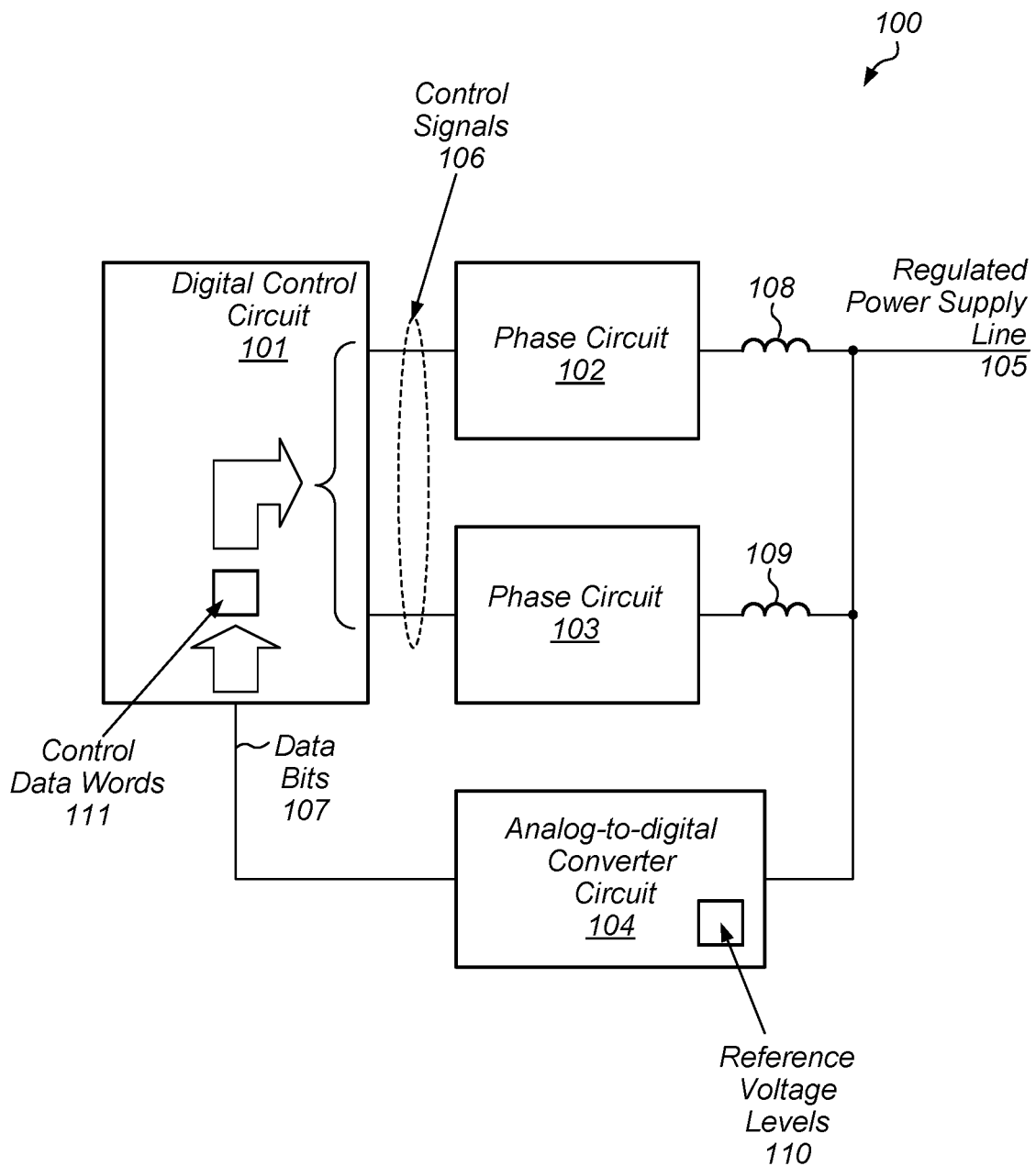
FIG. 1 is a block diagram of an embodiment of a power converter circuit for a computer system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular forms illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple power converter or voltage regulator circuits configured to generate regulated voltage levels for various power supply signals. Such voltage regulator circuits may employ both passive circuit elements (e.g., inductors, capacitors, etc.) as well as active circuit elements (e.g., transistors, diodes, etc.).

Many power converter and voltage regulator circuits employ a control loop, which senses a particular characteristic of a regulated power supply signal and compares a value of the particular characteristic to a threshold value. Based on results of the comparison, charging or discharging of a load circuit by a power converter or voltage regulator circuit may be halted.

In some cases, a power converter or voltage regulator circuit may include multiple phase circuits, each configured to activate at different time points to either source or sink current to a load circuit. Each phase circuit is controlled by a corresponding control loop that determines when each phase circuit halts operation once started.

Such control loops implemented in an analog fashion may be complex and difficult to design. For example, in a power converter or voltage regulator circuit that employs multiple phase circuits with coupled inductors, a determination must be made as to how to distribute current among the phases in order to maintain stability and gain of the control loops. Failure to maintain stability and gain of the control loops can result in the power converter or voltage regulator circuit being unable to maintain a target voltage level on the line for the regulated power supply signal. The embodiments illustrated in the drawings and described below may provide techniques for generating control signals for the phase circuits in the digital domain in order to reduce complexity, improve stability, and allow for simplified initialization.

A block diagram depicting an embodiment of a power converter circuit is depicted in FIG. 1. As illustrated, power converter circuit 100 includes digital control circuit 101, phase circuits 102 and 103, and analog-to-digital converter circuit 104. Although only two phase circuits are depicted in the embodiment illustrated in FIG. 1, in other embodiments, any suitable number of phase circuits may be employed.

Phase circuits 102 and 103 are each coupled to regulated power supply line 105 via inductors 108 and 109, respectively, and are configured to modify a voltage level of regulated power supply line 105 using a respective one of control signals 106. Each of phase circuits 102 and 103 may be separately enabled by respective timing or clock signals to source current to regulated power supply line 105. Once enabled, the duration of how long current is sourced to regulated power supply line 105 is determined based on current sensed through inductors 108 and 109 using a process commonly referred to as pulse width modulation or "PWM."

To perform PWM, control currents (also referred to as "demand currents") are compared to currents sensed through inductors 108 and 109. The voltage levels of control signals 106 may correspond to such control currents, which each of phase circuits 102 and 103 may compare to currents sensed through inductors 108 and 109, respectively. Based on results of the comparisons, phase circuits 102 and 103 may halt the sourcing of current into regulated power supply line 105 and allow current to flow back from regulated power supply line 105 into a ground supply signal.

Analog-to-digital converter circuit 104 is configured to compare a voltage level of regulated power supply line 105 to reference voltage levels 110 to generate data bits 107. As described below in more detail, analog-to-digital converter circuit 104 may generate reference voltage levels 110 using a divider circuit and may include multiple comparator circuits, each configured to compare the voltage level of regulated power supply line 105 to a corresponding one of reference voltage levels 110.

Digital control circuit 101 is configured to generate control data words 111 using data bits 107 and to generate a corresponding one of control signals 106 using a corresponding one of control data words 111. As used herein, a digital control circuit differs from an analog control circuit in that processing is performed in the digital domain using multiple logic gates. A digital control circuit does not perform analog processing operations such as current multiplication, voltage multiplication, and the like. By processing data bits 107 in the digital domain, the distribution of an overall demand current among phase circuits 102 and 103 can be more easily determined than using analog control loops and circuits, thereby reducing complexity and improving stability of power converter circuit 100.

Figure 2:
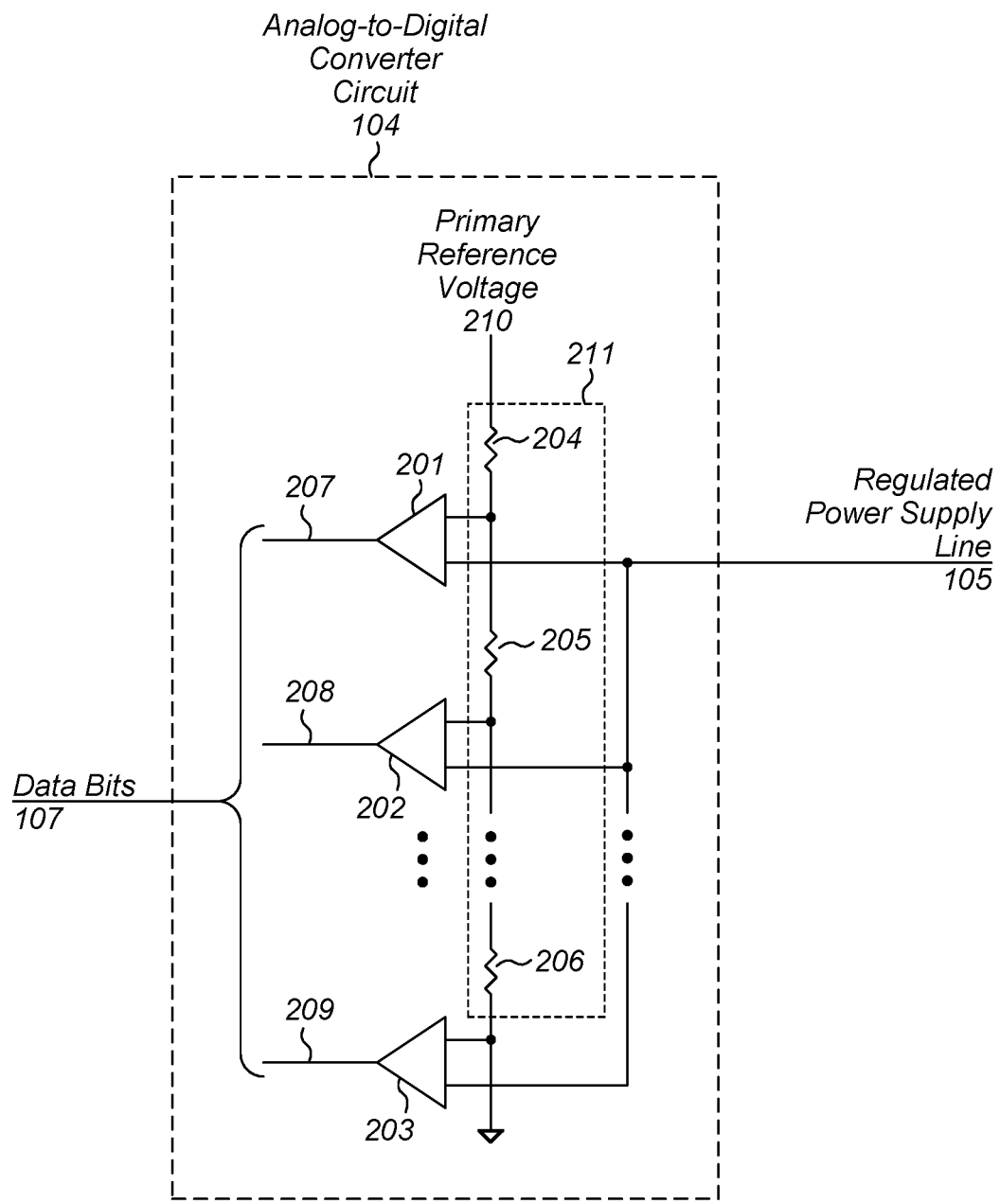
FIG. 2 illustrates a block diagram of an embodiment of an analog-to-digital converter circuit.

Turning to FIG. 2, an embodiment of analog-to-digital converter circuit 104 is depicted. In various embodiments, analog-to-digital converter circuit 104 may be a particular embodiment of a flash analog-to-digital converter circuit. As used and described herein, a flash analog-to-digital converter circuit is an analog-to-digital converter circuit that employs a linear voltage divider circuit to generate multiple reference voltage levels from a primary voltage reference, and multiple comparator circuits each configured to compare the input voltage level to a corresponding one of the multiple reference voltage levels. As illustrated, analog-to-digital converter circuit 104 includes comparator circuits 201-203 and voltage divider circuit 211.

Voltage divider circuit 211 may be a particular embodiment of a resistive voltage divider circuit and includes resistors 204-206 coupled together in a serial fashion. Resistor 204 is coupled to primary reference voltage 210, and resistor 206 is coupled to a ground supply signal. As current flows through resistors 204-206, a voltage is dropped across each one of resistors 204-206. For example, in some embodiments, the voltage drop across a particular one of resistors 204-206 may be in a range of 1 mV to 3 mV. Although resistor 204 is depicted as being coupled to primary reference voltage 210, in other embodiments, primary reference voltage 210 may be coupled between any two resistors included in voltage divider circuit 211. In such cases, resistors at the ends of the serial chain of resistors, e.g., resistors 204 and 206, may be coupled to the ground supply signal.

Each generated voltage is used as an input to a corresponding one of comparator circuits 201-203. It is noted that although voltage divider circuit 211 is depicted as using resistors, in other embodiments, voltage divider circuit 211 may employ capacitors or any other suitable combination of circuit elements.

The value of resistors 204-206 may be any suitable combination of values. For example, in some cases, resistors 204-206 may all provide the same resistance value, while in other cases, each of resistors 204-206 may provide a different resistance value. In various embodiments, each of resistors 204-206 may be fabricated from polysilicon, metal, or any other suitable material available in a semiconductor manufacturing process. In some cases, resistors 204-206 may be fabricated on a silicon or other substrate different from one on which comparator circuits 201-203 are fabricated. Although only three resistors are shown in voltage divider circuit 211, in other embodiments, any suitable number of resistors may be employed.

Comparator circuits 201-203 may be particular embodiments of differential amplifier circuits, or any other suitable comparator circuits configured to generate an output voltage level proportional to a difference between the voltage levels of two input signals. As illustrated, comparator circuit 201 is configured to compare the voltage level of regulator power supply line 105 to a voltage level generated by the voltage drop generated by resistor 204. In a similar fashion, comparator circuits 202 and 203 are configured to compare the voltage level of regulated power supply line 105 to voltage levels generated by the voltage drops generated by resistors 205 and 206, respectively.

Comparator circuits 201-203 may be further configured to generate data bits 207-209, which are included in data bits 107, at periodic time intervals. For example, comparator circuit 201 may output a new value for data bit 207 each nanosecond. Although only three comparator circuits are depicted in the embodiment of FIG. 2, in other embodiments, any suitable number of comparator circuits may be employed.

Figure 3:
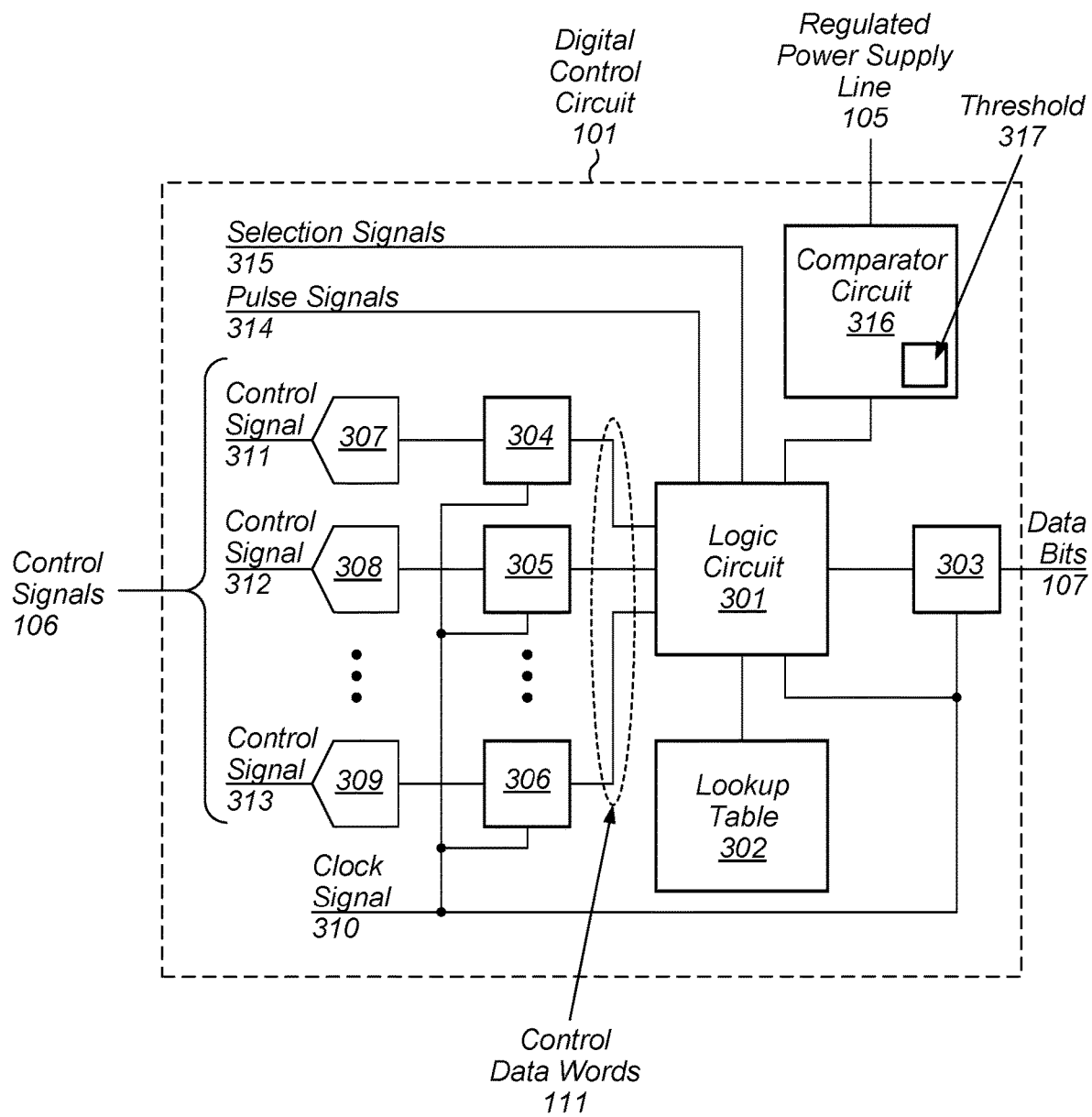
FIG. 3 illustrates a block diagram of an embodiment of a control circuit for a power generator circuit.

A block diagram depicting an embodiment of digital control circuit 101 is illustrated in FIG. 3. As illustrated, digital control circuit 101 includes logic circuit 301, lookup table 302, register circuits 303-306, digital-to-analog converter circuits 307-309, and comparator circuit 316.

Register circuit 303 may include multiple latch or flip-flop circuits, each configured to store a respective one of data bits 107 using clock signal 310. For example, on each rising edge of clock signal 310, a particular one of the latch or flip-flop circuits in register circuit 303 may sample and hold a value of a corresponding one of data bits 107 for use by logic circuit 301. Clock signal 310 may be of any suitable frequency. For example, in some embodiments, the frequency of clock signal 310 may be 1 GHz.

Logic circuit 301 may be configured to generate control data words 111 using the output of register circuit 303 and clock signal 310. In some cases, the processing may include determining an allocation of the overall demand current to individual phase circuits. In various embodiments, logic circuit 301 may be a particular embodiment of a state machine or sequential logic circuit. In other embodiments, logic circuit 301 may be a processor or controller circuit configured to execute instructions stored in a memory circuit (not shown). Logic circuit 301 may be placed in a particular state or otherwise initialized during a reset or boot operation. In some cases, logic circuit 301 may process the stored versions of data bits 107 such that an effective gain through digital control circuit 101 may be adjusted. By adjusting the effective gain through digital control circuit 101, a desired load line for power converter circuit 100 may be achieved. As used herein, a load line refers to a relationship between an output voltage of a power converter circuit and an output current of the power converter circuit. Precise control over the power converter's load line may be used to save power when processor circuits are experiencing heavy loads.

Each of register circuits 304-306 is configured to store the data bits included in each one of control data words 111 using clock signal 310. In various embodiments, a number of latch or flip-flop circuits included in each of register circuits 304-306 may correspond to a number of data bits included in a given one of control data words 111. For example, in some embodiments, the given one of control data words 111 includes five data bits, and each of register circuits 304-306 include five latch or flip-flop circuits. Although three control data words are depicted in FIG. 3, in other embodiments, any suitable number of control data words may be employed.

Each of digital-to-analog converter circuits 307-309 are configured to generate a respective voltage level on control signals 311-313 (all part of control signals 106) using a corresponding one of control data words 111. For example, digital-to-analog converter circuit 307 is configured to generate a voltage level on control signal 311 based on the particular one of control data words 111 stored in register circuit 304. As clock signal 310 toggles, new values for control data words 111 are stored in register circuits 304-306. Digital-to-analog converter circuits 307-309, using the new values for control data words 111 stored in register circuits 304-306, may then update the voltage levels on control signals 311-313.

Comparator circuit 316 is configured to compare a voltage level of regulated power supply line 105 to threshold 317. In various embodiments, comparator circuit 316 may be a particular embodiment of a differential amplifier or other circuit configured to generate an output signal based on a difference between voltage levels of two input signals. In some cases, comparator circuit 316 is configured to generate a digital output signal that can be used by logic circuit 301.

Logic circuit 301 is further configured to generate pulse signals 314 and selection signals 315 based on results from comparator circuit 316. As described below, pulse signals 314 and selection signals 315 may be used by phase circuits, e.g., phase circuit 102, to bypass internal control circuits within the phase circuits and directly source and sink current from regulated power supply line 105.

In various embodiments, to generate pulse signals 314 and selection signals 315, logic circuit 301 may retrieve information from lookup table 302. Such information may be used by logic circuit 301 to determine the duration of pulse signals 314, and the like. The retrieval of information from lookup table 302 may be based on a magnitude of the voltage level of regulated power supply line 105, a difference between the voltage level of regulated power supply line 105 and threshold 317, or any other suitable criteria. It is noted that, in some cases, a particular pulse may be truncated by logic circuit 301 in response to a determination that the voltage level of regulated power supply line 105 exceeds an upper threshold value.

Lookup table 302 may be a particular embodiment of a static random-access memory, register file circuit, non-volatile memory circuit, or any other suitable circuit configured to store the aforementioned information. In various embodiments, the information may be stored in lookup table 302 during an initialization or boot process. In some cases, the information stored in lookup table 302 may be modified during operation based on performance characteristics of the power converter circuit, the computer system, or any other suitable criteria.

Figure 4:
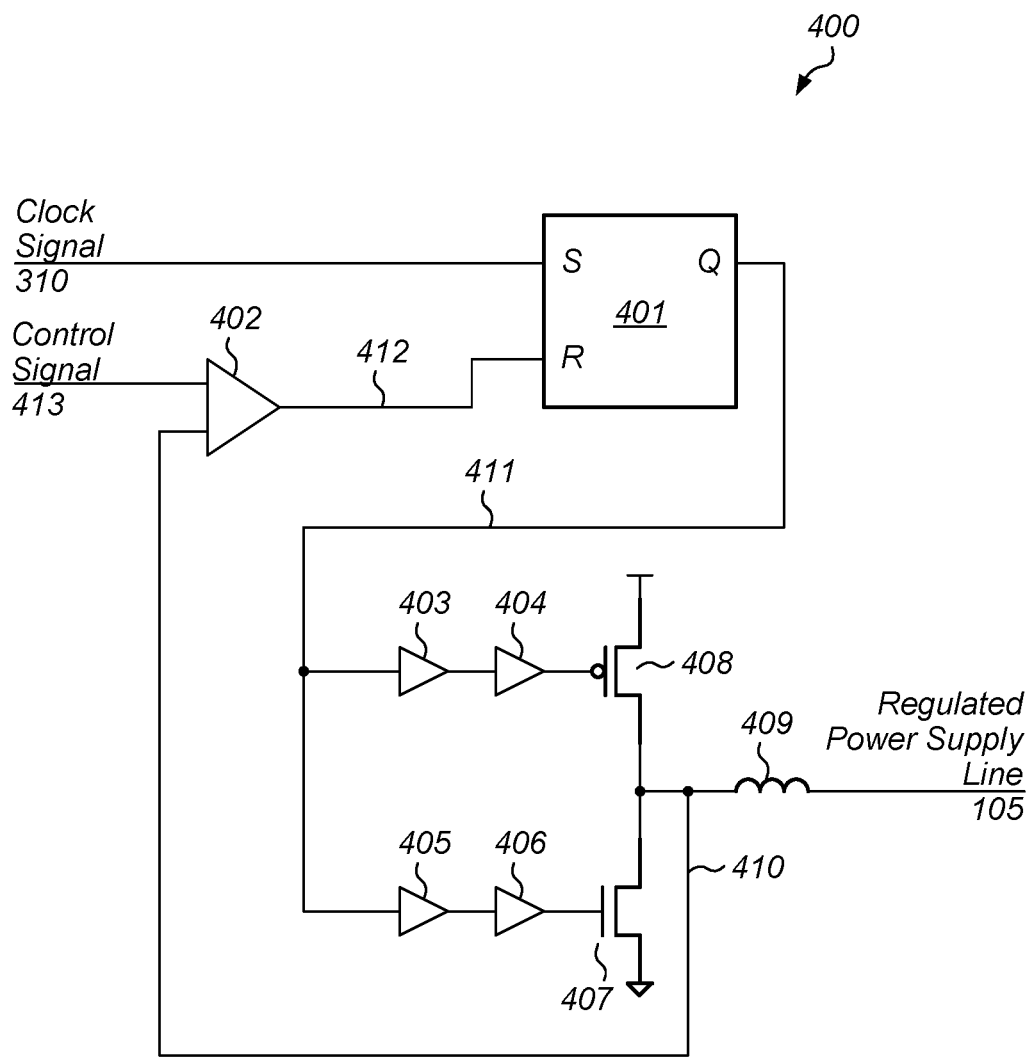
FIG. 4 illustrates a block diagram of an embodiment of a phase circuit.

A block diagram of an embodiment of a phase circuit (also referred to as a "phase unit") is depicted in FIG. 4. As illustrated, phase circuit 400 includes latch circuit 401, comparator circuit 402, buffer circuits 403-406, devices 407 and 408, and inductor 409.

Comparator circuit 402 may be a particular embodiment of a differential amplifier or other amplifier circuit configured to generate a digital output voltage level based on a comparison between the voltage levels of two input signals. As illustrated, comparator circuit 402 is configured to compare a voltage level of control signal 413 to a voltage level of circuit node 410 to generate a reset signal on node 412. In various embodiments, the voltage level of control signal 413 may correspond to a particular control current and the voltage level of circuit node 410 may correspond to a value of a current flowing through inductor 409 (referred to as a "sensed inductor current"). Comparator circuit 402 may, in various embodiments, be configured to generate a high logic value on node 412 when the voltage level of circuit node 410 is greater than or equal to the voltage level of control signal 413.

Latch circuit 401 may be a particular embodiment of a set-reset latch ("SR latch"). In various embodiments, a high logic level on clock signal 310 and a low logic level on node 412 sets latch circuit 401 resulting in a high logic level on node 411. Node 411 will remain at a high logic level until a high logic level is present on node 412, which resets latch circuit 401.

As used and described herein, a logical-0, logic 0 value, or low logic level, describes a voltage sufficient to activate a p-channel metal-oxide semiconductor field effect transistor (MOSFET), and a logical-1, logic 1 value, or high logic level describes a voltage level sufficient to activate an n-channel MOSFET. It is noted that, in various other embodiments, any suitable voltage levels for logical-0 and logical-1 may be employed.

Buffer circuits 403 and 404 are configured to provide additional drive and translate the logic level present on node 411 in order to activate and deactivate device 408, and buffer circuits 405 and 406 are configured to provide additional drive and translate the logic level present on node 411 in order to activate and deactivate device 407. For example, a high logic level on node 411 may be translated by buffer circuits 403 and 404 such that device 408 is activated, allowing current to flow through device 408 through inductor 409 and into a load circuit coupled to regulated power supply line 105. Additionally, buffer circuits 405 and 406 may translate the high logic level on node 411 such that device 407 is inactive.

When a low logic level is present on node 411, buffer circuits 403 and 404 may translate the low logic level such that device 408 is inactive, while buffer circuits 405 and 406 translate the low logic level such that device 407 is active, allowing current to flow from the load circuit through device 407 into the ground supply.

In various embodiments, buffer circuits 403-406 may include one or more inverter circuits. As used herein, inverter circuits may be particular embodiments of inverting amplifiers configured to generate an output signal with an opposite logical sense of an input signal. In other embodiments, any suitable type of inverting amplifier may be employed, including inverting amplifiers constructed with technologies other than CMOS.

Devices 407 and 408 may be particular embodiments of transconductance devices where the current flowing through such a device is based upon a voltage across the device. For example, in various embodiments, a device may be a p-channel or n-channel metal-oxide semiconductor field-effect transistor (MOSFET), a PNP or NPN bipolar transistor, or any other suitable transconductance device. In the illustrated embodiment, device 407 may be an n-channel MOSFET and device 408 may be a p-channel MOSFET.

Inductor 409, along with the remaining circuit elements of phase circuit 400, may be fabricated on a common silicon substrate. Alternatively, inductor 409 may be fabricated on a different substrate than the remaining circuit elements in phase circuit 400. A magnetic field generated by an inductor in a particular phase circuit may induce a current in an inductor in a different phase circuit. In some cases, inductors included in different phase circuits are physically oriented so as to allow each inductor to induce a desired amount of current in the other inductor. Inductors oriented in such a fashion are commonly referred to as being "mutually coupled inductors."

Figure 5:
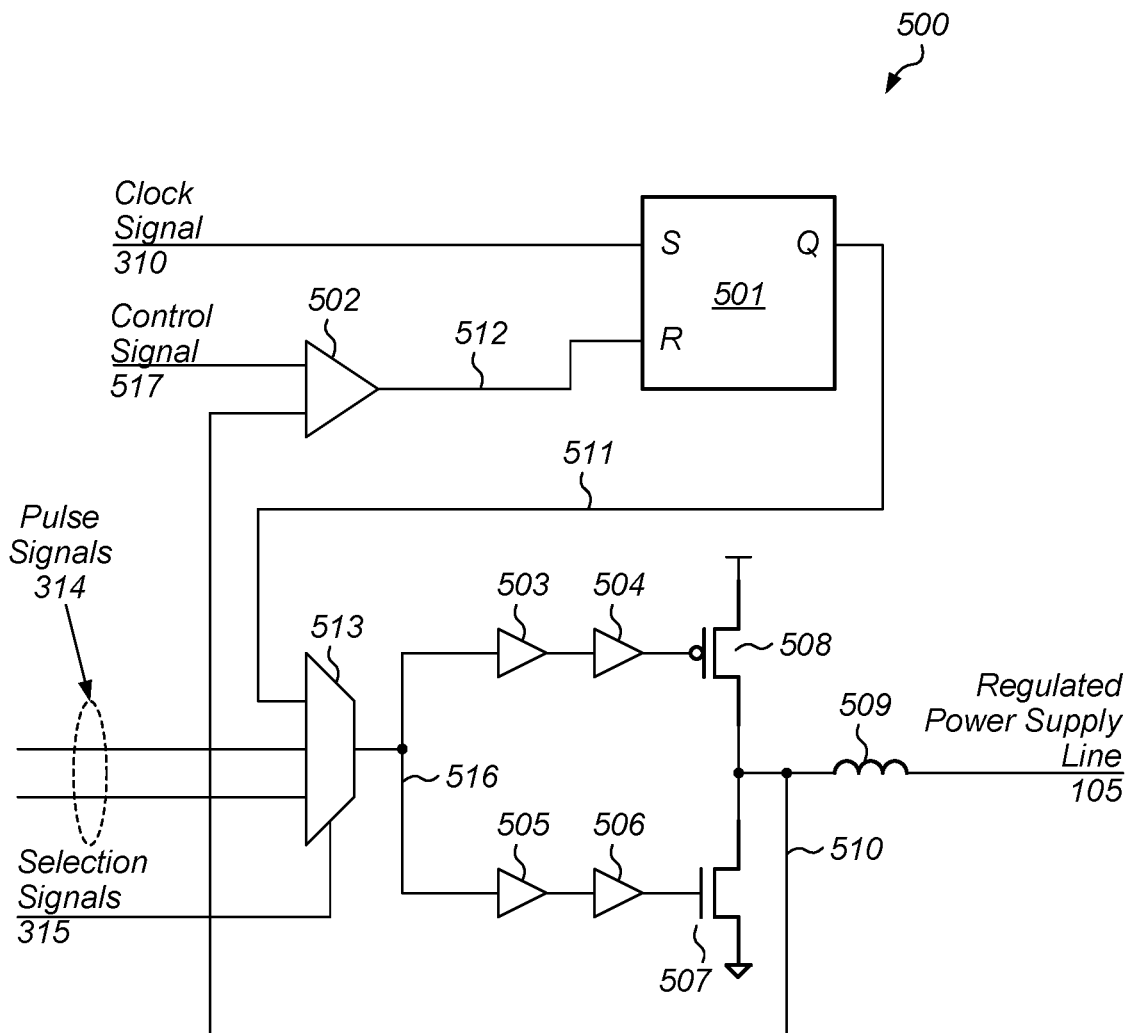
FIG. 5 illustrates a block diagram of another embodiment of a phase circuit.

As described below in more detail, bypassing a phase circuit's typical control path and directly introducing pulses into buffer circuits coupled to devices driving the inductor may improve the performance of a power converter or voltage regulator circuit. A block diagram of another embodiment of a phase circuit is illustrated in FIG. 5. As illustrated, phase circuit 500 includes latch circuit 501, comparator circuit 502, buffer circuits 503-506, devices 507 and 508, inductor 509, and multiplex circuit 513.

Like comparator circuit 402, comparator circuit 502 is configured to compare a voltage level of control signal 517 (which may be included in control signals 106) and a voltage level of node 510. Latch circuit 501, like its counterpart, latch circuit 401 in FIG. 4, is configured to set a high logic level on node 511 in response to a high logic level on clock signal 310 and a low logic level on node 512. In response to a high logic level on node 512, latch circuit 501 sets a low logic level on node 511. Buffer circuits 503-506, devices 507 and 508, and inductor 509 are configured to operate in a similar fashion to buffer circuits 403-406, devices 407 and 408, and inductor 409, respectively.

Multiplex circuit 513 is configured to selectively couple either node 511 or one of pulse signals 314 to node 516 using selection signals 315. When one of pulse signals 314 are coupled to node 516, the control path through latch circuit 501 is bypassed, activating devices 507 and 508 directly through buffer circuits 503-506. As described above in regard to FIG. 3, pulse signals 314 may be generated using information retrieved from lookup table 302 in response to the voltage level of regulated power supply line 105 being below a threshold value. By activating devices 508 and 507 through the use of pulse signals 314 when phase circuit 500 would otherwise be inactive, allows phase circuit 500 to compensate for drops in the voltage of regulated power supply line 105 as well as providing additional current to a load circuit when other phase circuits are being initialized.

Multiplex circuit 513 may be designed according to one of various design styles. For example, in some embodiments, multiplex circuit 513 may include any suitable combination of static logic gates configured to implement the desired multiplex function. In other cases, multiplex circuit 513 may employ multiple pass gate or other suitable circuits arranged in a wired-OR fashion. A particular one of the pass gate circuits may be activated using selection signals 315.

Although only two pulse signals are depicted in FIG. 5, any suitable number of pulse signals, each having a different duration, may be employed.

Figure 6:
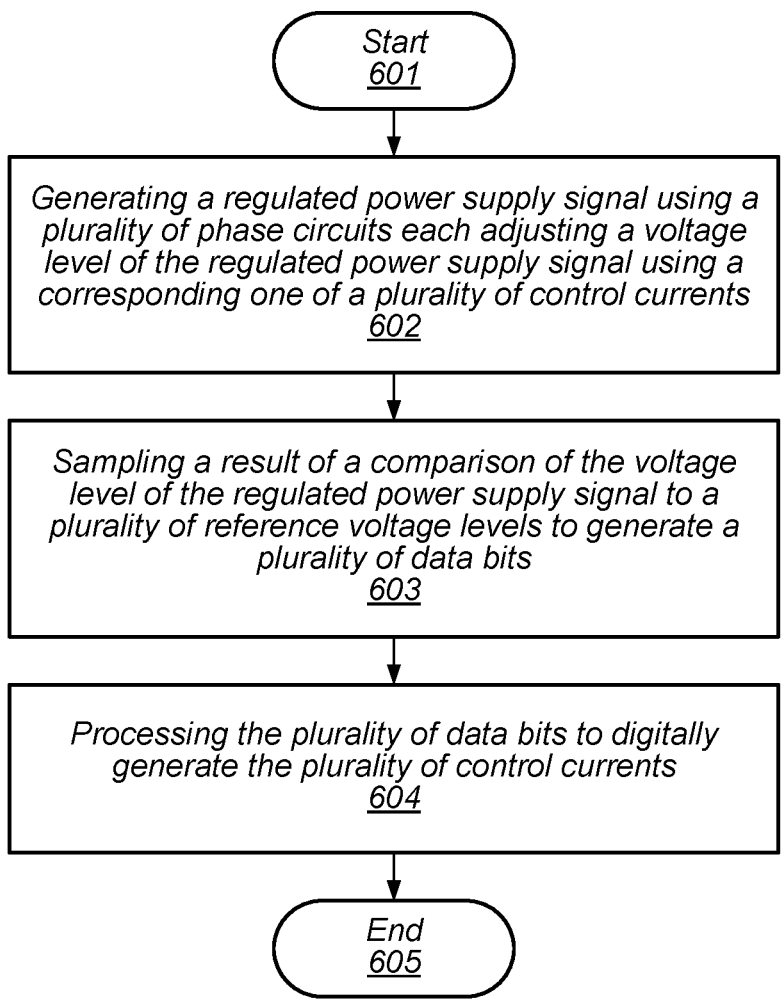
FIG. 6 illustrates a flow diagram depicting an embodiment of a method for operating a power converter circuit.

Turning to FIG. 6, a flow diagram depicting an embodiment of a method for operating a power converter circuit is illustrated. The method, which may be applied to various power converter circuits, e.g., power converter circuit 100, begins in block 601.

The method includes generating a regulated power supply signal using a plurality of phase circuits each adjusting a voltage level of the regulated power supply signal using a corresponding one of a plurality of control currents (block 602). In various embodiments, each phase circuit may adjust the voltage level of the regulated power supply signal by either sourcing or sinking current from the signal line of the regulator power supply signal. Each of the phase circuits is activated using a corresponding clock signal or other timing reference signal, and is deactivated based on a comparison of its associated control current with a respective current sensed at the output of the phase circuit. In some embodiments, the method includes comparing a particular control current of the plurality of control currents to a sensed inductor current, generating a reset signal using results of comparing the particular control current of the plurality of control currents to the sensed inductor current, and resetting a flip-flop circuit using the reset signal to deactivate a corresponding phase circuit.

The method also includes sampling a result of a comparison of the voltage level of the regulated power supply signal to a plurality of reference voltage levels to generate a plurality of data bits (block 603). In various embodiments, the voltage level of the regulated supply signal is compared to the plurality of reference voltage levels using a flash analog-to-digital converter or other suitable circuit. Such reference voltage levels may be generated using a resistive voltage divider coupled to a primary voltage reference.

The method further includes processing the plurality of data bits to digitally generate the plurality of control currents (block 604). In some embodiments, processing the plurality of data bits includes generating a plurality of output codes, and converting each output code of the plurality of output codes to a corresponding one of the plurality of control currents using a respective one of a plurality of digital-to-analog converter circuits. In some cases, the method also includes storing each output code of the plurality of output codes in a respective one of a plurality of register circuits, and activating each register circuit of the plurality of register circuits using a clock signal. The method ends in block 605.

In some cases, once a phase circuit has been de-activated, e.g., setting latch circuit 401 by control signal 413, the phase circuit cannot react to changes in the voltage level of a regulated power supply signal until a subsequent pulse on clock signal 310. Since the circuit cannot react, the voltage level of the regulated power supply signal may drop below a target level.

Additionally, when a power converter or voltage regulator circuit is initially activated, certain analog circuit components, e.g., comparator circuit 402, may initialize and stabilize over a period of time. During such times, the power converter or voltage regulator circuit may be unable to maintain the voltage level of the regulated power supply signal at the target level.

Figure 7:
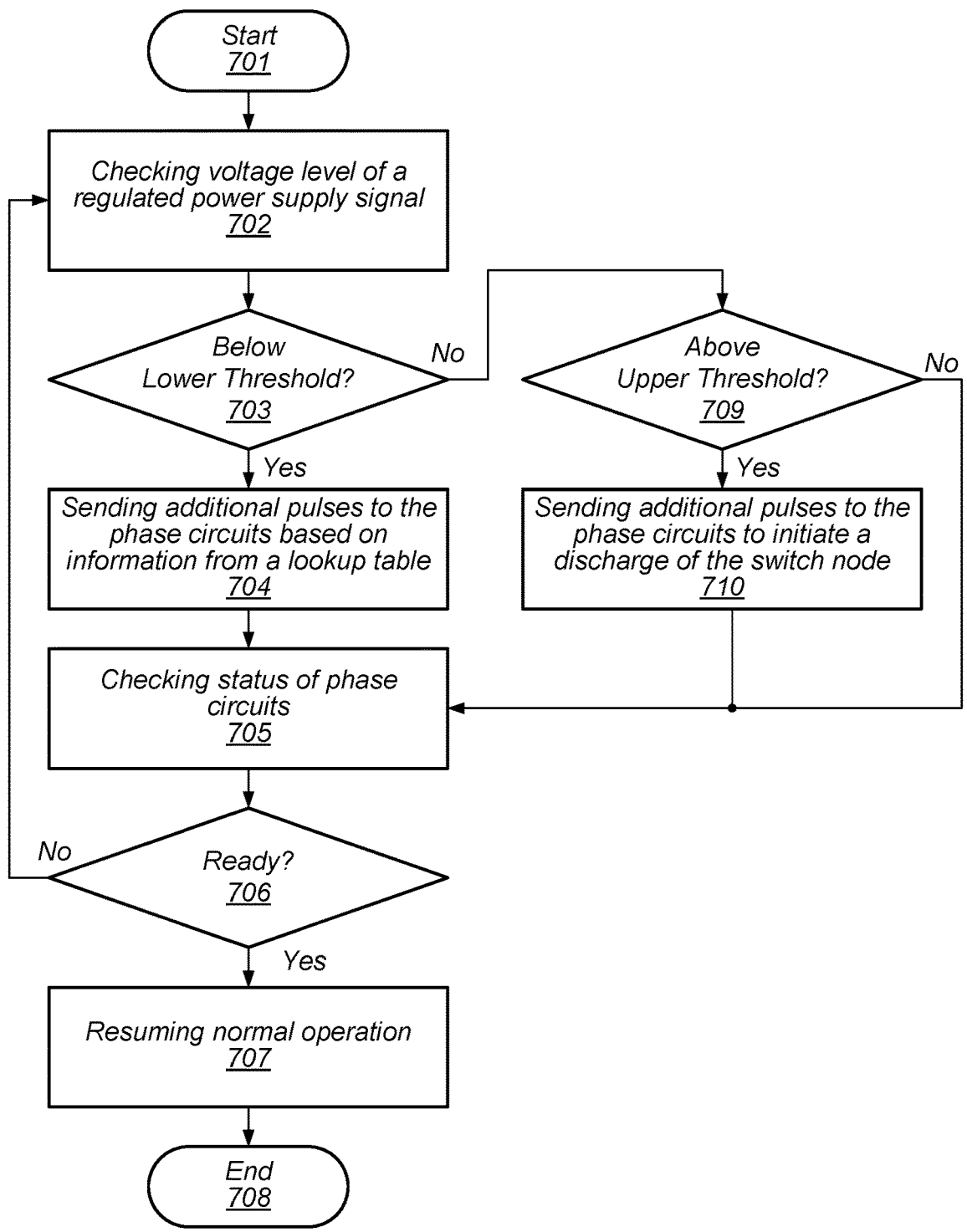
FIG. 7 illustrates a flow diagram depicting an embodiment of another method for operating a power converter circuit.

To improve performance of a power converter or voltage regulator circuit during the circumstances described above, additional pulses may be sent to one or more of the phase circuits included in the power converter or voltage regulator circuit to increase a frequency of activity within the power converter or voltage regulator circuit. A flow diagram depicting another embodiment of a method for employing additional pulses to the phase circuits in a power converter circuit is illustrated in FIG. 7. The method, which may be applied to various power converter circuits, e.g., power converter circuit 100, begins in block 701.

The method includes checking a voltage level of a regulated power supply signal (block 702). In various embodiments, checking the voltage level of the regulated power supply signal may include comparing the voltage level of the regulated power supply signal to one or more threshold values. The method may then depend on a result of checking the voltage level of the regulated power supply signal (block 703).

If the voltage level of the regulated power supply signal is less than a lower threshold value, then the method includes sending additional pulses to the phase circuits based on information from a lookup table (block 704). In various embodiments, the lookup table may include multiple entries, each specifying a number of additional pulses to be sent to the phase circuits based on the voltage level of the regulated power supply signal, a difference between the voltage level of the regulated power supply signal and a threshold value, or any other suitable criterion. The information stored in the lookup table may allow for additional pulses to be sent to a single phase circuit or multiple phase circuits.

The method also includes checking the status of the phase circuits (block 705). During operation of the power converter circuit, phase circuits may be enabled or disabled based on power requirements of load circuits coupled to the power converter circuits. In various embodiments, it may take a period of time for certain circuits within a particular phase circuit to initialize once the particular phase circuit has been enabled.

If the voltage level of the regulated power supply signal is greater than the lower threshold value, the method may depend on a comparison of the voltage level of the regulated power supply signal to an upper threshold value (block 709). If the voltage level of the regulated power supply signal is greater than the upper threshold value, the method includes sending additional pulses to the phase circuits to initiate a discharge of the switch node (block 710). By checking the voltage level of the regulated power supply signal against the upper threshold value, overshoot resulting from the additional pulses generated in block 704 may be limited, thereby keeping the voltage level of the regulated power supply signal close to the desired voltage level. Following the sending of the pulses to discharge the switch node, the method may then proceed from block 705 as described above.

If the voltage level of the regulated power supply signal is less than the upper threshold, then the method proceeds from block 705 as described above. The method may then depend on the status of the phase circuits (block 706).

If the phase circuits are ready, the method includes resuming normal operation (block 707). Alternatively, if the phase circuits are not ready, then the method proceeds from block 702 as described above. The method concludes in block 708.

Figure 8:
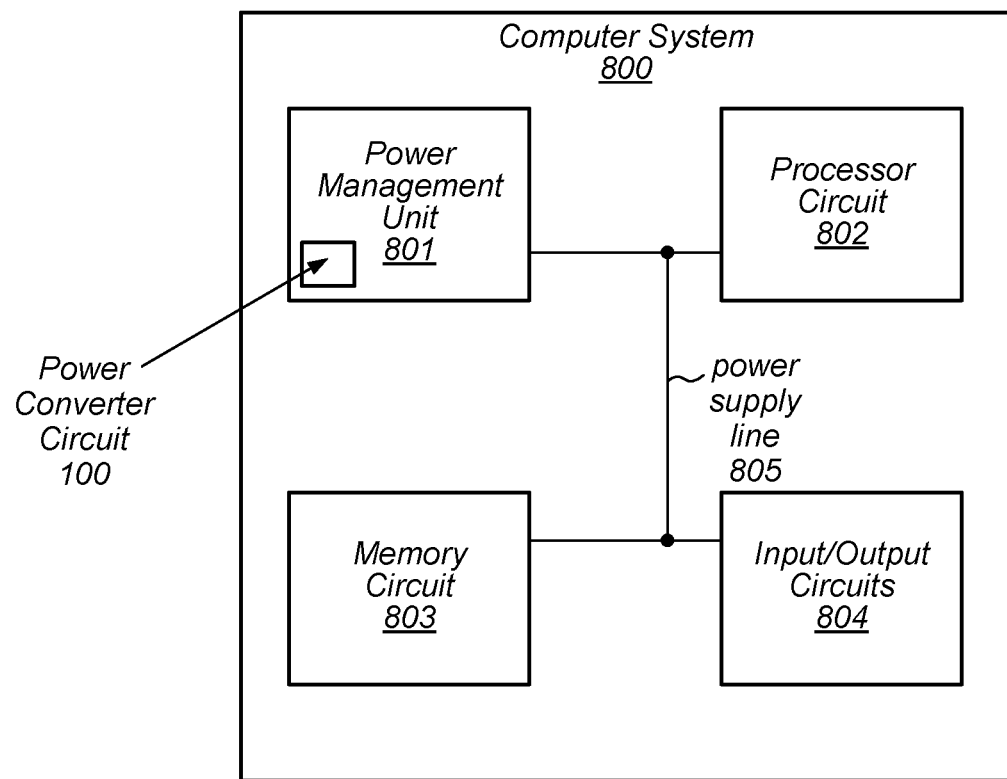
FIG. 8 is a block diagram of one embodiment of a computer system that includes a power converter circuit.

A block diagram of a computer system is illustrated in FIG. 8. In the illustrated embodiment, computer system 800 includes power management unit 801, processor circuit 802, memory circuit 803, and input/output circuits 804, each of which is coupled to power supply line 805. In various embodiments, computer system 800 may be a system-on-a-chip (SoC) and/or be configured for use in a desktop computer, server, or in a mobile computing application such as, e.g., a tablet, laptop computer, or wearable computing device.

Power management unit 801 includes power converter circuit 100 which is configured to generate a regulated voltage level on power supply line 805 in order to provide power to processor circuit 802, input/output circuits 804, and memory circuit 803. Although power management unit 801 is depicted as including a single power converter circuit, in other embodiments, any suitable number of power converter circuits may be included in power management unit 801, each configured to generate a regulated voltage level on a respective one of multiple power supply signals included in computer system 800. When multiple power converter circuits are employed, each one may b e separately configured by storing information in a corresponding lookup table, as well as initializing sequential logic circuits or register circuits included within a logic circuit, e.g., logic circuit 301, included in each power converter circuit.

Processor circuit 802 may, in various embodiments, be representative of a general-purpose processor that performs computational operations. For example, processor circuit 802 may be a central processing unit (CPU) such as a microprocessor, a microcontroller, an application-specific integrated circuit (ASIC), or a field-programmable gate array (FPGA).

Memory circuit 803 may, in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 8, in other embodiments, any suitable number of memory circuits may be employed.

Input/output circuits 804 may be configured to coordinate data transfer between computer system 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol.

Input/output circuits 804 may also be configured to coordinate data transfer between computer system 800 and one or more devices (e.g., other computing systems or integrated circuits) coupled to computer system 800 via a network. In one embodiment, input/output circuits 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a plurality of phase circuits coupled to a regulated power supply line via a corresponding plurality of inductors and configured to modify a voltage level of the regulated power supply line using respective ones of a plurality of control signals;
    an analog-to-digital converter circuit configured to generate a plurality of data bits based on a voltage level of the regulated power supply line; and
    a control circuit configured to:
        perform a comparison of the voltage level of the regulated power supply line to a threshold value;
        generate a plurality of digital control words using a result of the comparison and the plurality of data bits; and
        convert the plurality of digital control words to respective analog values to generate the plurality of control signals.

2. The apparatus of claim 1, wherein the analog-to-digital converter circuit includes a voltage divider circuit configured to generate a plurality of reference voltage levels using a primary voltage reference.

3. The apparatus of claim 2, wherein the analog-to-digital converter circuit further includes a plurality of comparator circuits configured to compare the voltage level of the regulated power supply line to corresponding ones of the plurality of reference voltage levels.

4. The apparatus of claim 1, wherein the control circuit is further configured to generate at least one pulse signal in response to a determination that the voltage level of the regulated power supply line is less than the threshold value.

5. The apparatus of claim 4, wherein the control circuit includes a lookup table configured to store a plurality of entries including a given entry that specifies a number of pulses to be sent to a given phase circuit of the plurality of phase circuits.

6. The apparatus of claim 5, wherein a particular phase circuit of the plurality of phase circuits is configured to source current to the regulated power supply line in response to receiving the at least one pulse signal.

7. A method, comprising:
    generating a regulated power supply signal using a plurality of phase circuits configured to adjust a voltage level of the regulated power supply signal using a corresponding one of a plurality of control currents;
    sampling a result of a comparison of the voltage level of the regulated power supply signal to a plurality of reference voltage levels to generate a plurality of data bits;
    processing the plurality of data bits to digitally generate a plurality of control data words; and converting the plurality of control data words to respective analog values to generate the plurality of control currents.

8. The method of claim 7, further comprising performing a comparison the voltage level of the regulated power supply signal to a threshold value, and generating, based on results of the comparison, at least one pulse to activate a particular one of the plurality of phase circuits.

9. The method of claim 7, further comprising generating the plurality of reference voltage levels using a primary reference voltage and a resistive voltage divider.

10. The method of claim 7, further comprising generating at least one pulse signal in response to determining that the voltage level of the regulated power supply signal is less than a threshold value.

11. The method of claim 10, wherein generating the at least one pulse signal includes retrieving information from a lookup table using the voltage level of the regulated power supply signal.

12. The method of claim 11, further comprising adjusting a duration of the at least one pulse signal using the information from the lookup table.

13. The method of claim 10, further comprising sourcing, by a particular phase circuit of the plurality of phase circuits in response to receiving the at least one pulse signal, a current to a load circuit coupled to the regulated power supply signal.

14. An apparatus, comprising:
a plurality of circuit blocks coupled to a power supply line; and
a power management unit that includes a power converter circuit including a plurality of phase circuits, wherein the power converter circuit is configured to:
generate a regulated power supply signal on the power supply line;
generate a plurality of data bits based on the regulated power supply signal;
perform a comparison of the regulated power supply signal to a threshold value;
generate a plurality of digital control words using a result of the comparison and the plurality of data bits; and
convert the plurality of digital control words to respective analog values to generate a plurality of control signals; and
wherein the plurality of phase circuits are configured to source respective supply currents to the power supply lines based on corresponding ones of the plurality of control signals.

15. The apparatus of claim 14, wherein the power converter circuit is further configured to generate a pulse signal for a particular phase circuit of the plurality of phase circuits in response to a determination that a different phase circuit of the plurality of phase circuits is initializing.

16. The apparatus of claim 14, wherein the plurality of phase circuits are coupled to the power supply line via respective inductors of a plurality of inductors.

17. The apparatus of claim 16, wherein to generate the plurality of data bits, the power converter circuit is further configured to compare the regulated power supply signal to a plurality of reference voltage levels.

18. The apparatus of claim 14, wherein the power converter circuit is further configured to generate at least one pulse signal using a result of the comparison.

19. The apparatus of claim 18, wherein the power converter circuit includes a lookup table and, wherein to generate the at least one pulse signal, the power converter circuit is further configured to retrieve information from the lookup table using data indicative of the regulated power supply signal, and generate the at least one pulse signal using the information retrieved from the lookup table.

* * * * *